United States Patent [19]

Thompson et al.

[11] Patent Number: 5,224,503
[45] Date of Patent: Jul. 6, 1993

[54] CENTRIFUGAL WAFER CARRIER CLEANING APPARATUS

[75] Inventors: Raymon F. Thompson, Lakeside; Aleksander Owczarz, Kalispell, both of Mont.

[73] Assignee: Semitool, Inc., Kalispell, Mont.

[21] Appl. No.: 901,614

[22] Filed: Jun. 15, 1992

[51] Int. Cl.⁵ .............................................. B08B 3/02
[52] U.S. Cl. ...................... 134/95.2; 134/95.3; 134/153; 134/902
[58] Field of Search ................ 134/95.2, 153, 902, 134/95.3, 99.1, 103.2

[56] References Cited

U.S. PATENT DOCUMENTS

| | | | |
|---|---|---|---|
| 3,727,620 | 4/1973 | Orr | 134/95.2 |
| 4,132,567 | 1/1979 | Blackwood | 134/153 X |
| 4,197,000 | 4/1980 | Blackwood | 134/95.2 X |
| 5,038,809 | 8/1991 | Rodgers et al. | 134/153 X |

FOREIGN PATENT DOCUMENTS 0012576  1/1977  Japan .................................. 134/902

*Primary Examiner*—Philip R. Coe
*Attorney, Agent, or Firm*—Wells, St. John, Roberts, Gregory & Matkin

[57] ABSTRACT

Apparatus for cleaning carriers used to hold semiconductor wafers, substrates, data disks, flat panel displays and similar containers used in applications highly sensitive to contamination. The apparatus has a processing bowl with entrance and exit ports through which carriers are installed and removed from a processing chamber. A rotor rotates within the processing chamber. The rotor includes a rotor cage which mounts detachable wafer carrier supports. Filtered, heated air is passed through the process chamber for drying. Cleaning liquid and additional drying gas can be supplied through manifolds positioned inside and outside the rotor cage.

55 Claims, 14 Drawing Sheets

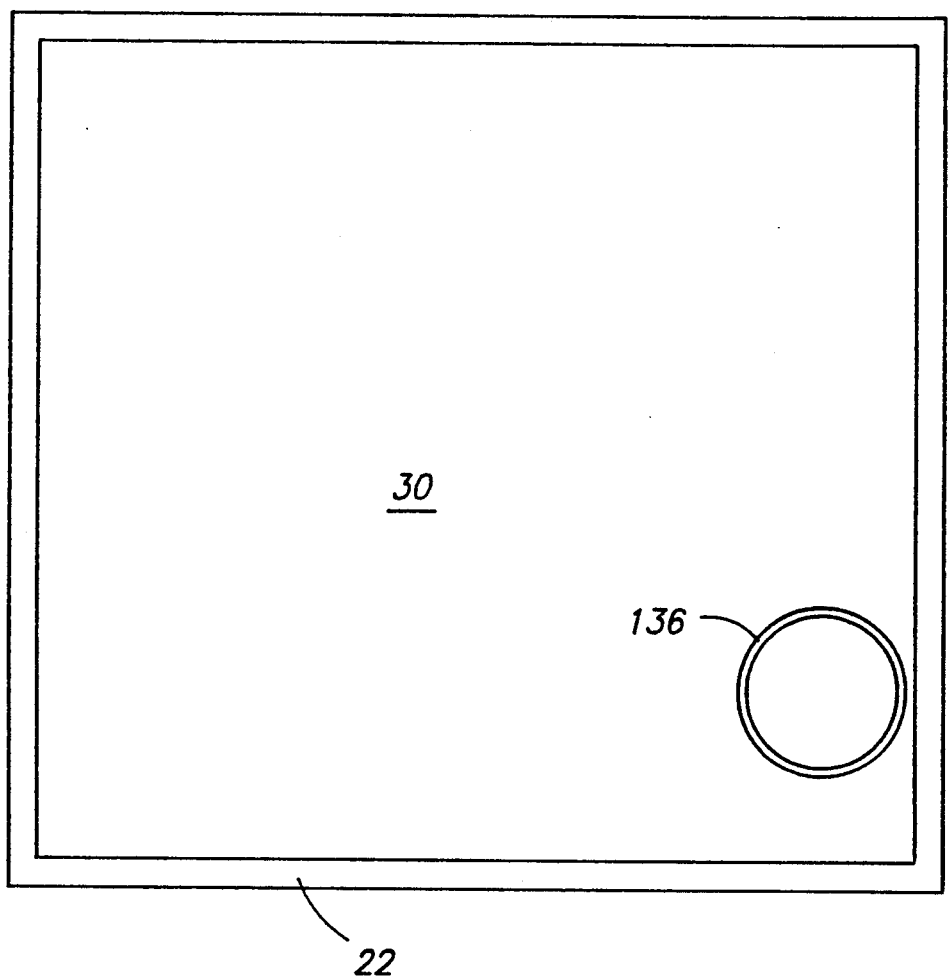

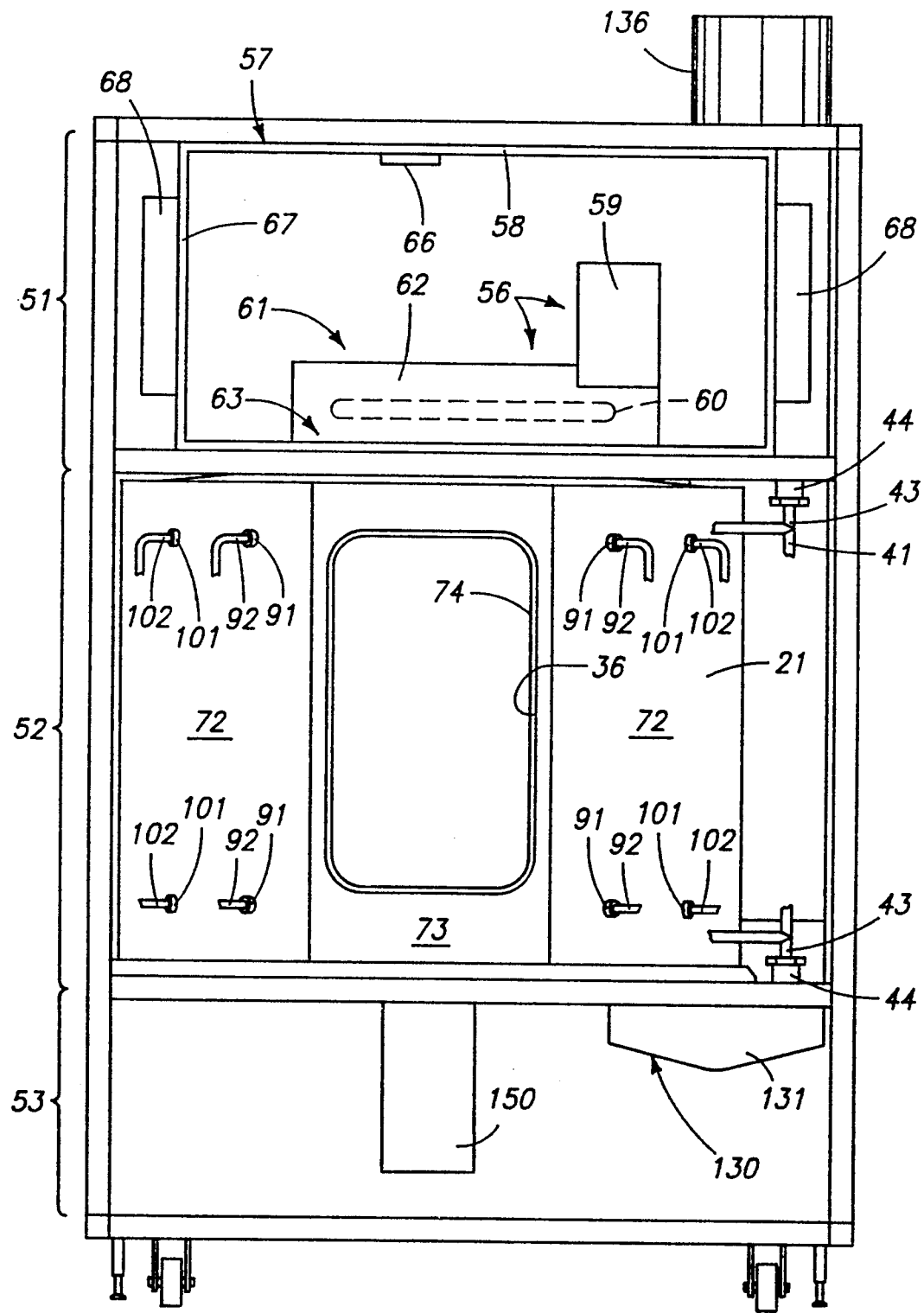

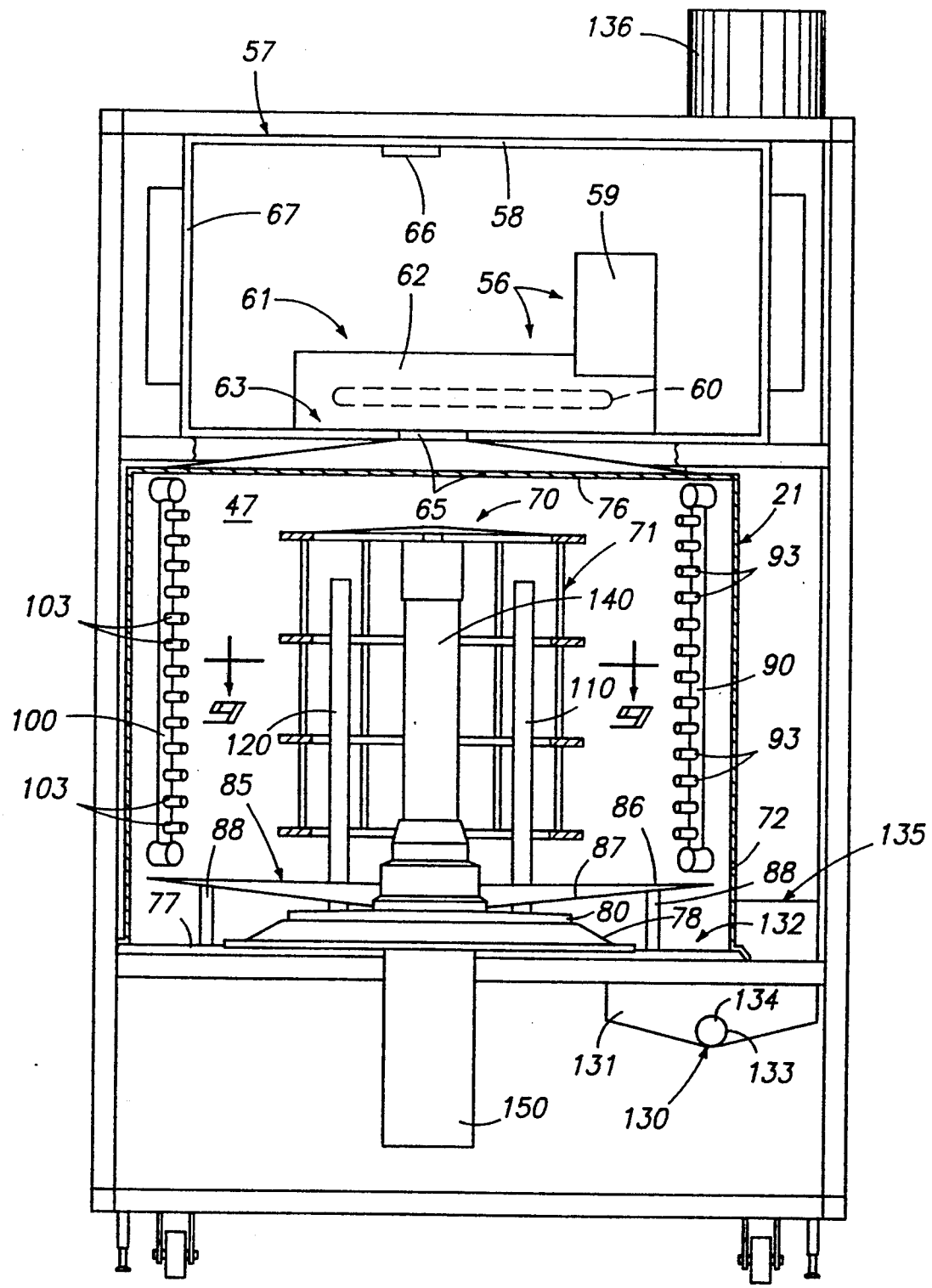

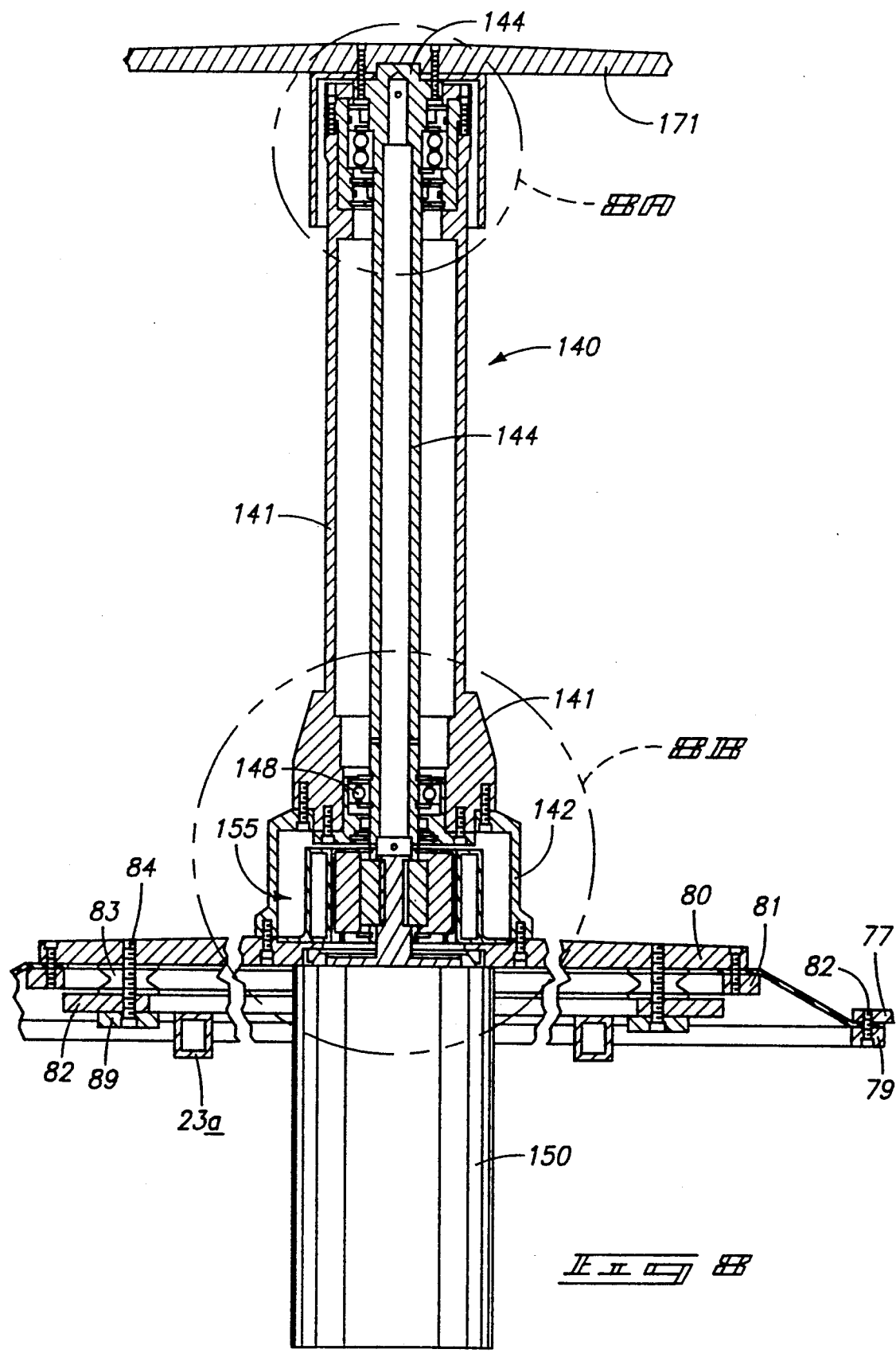

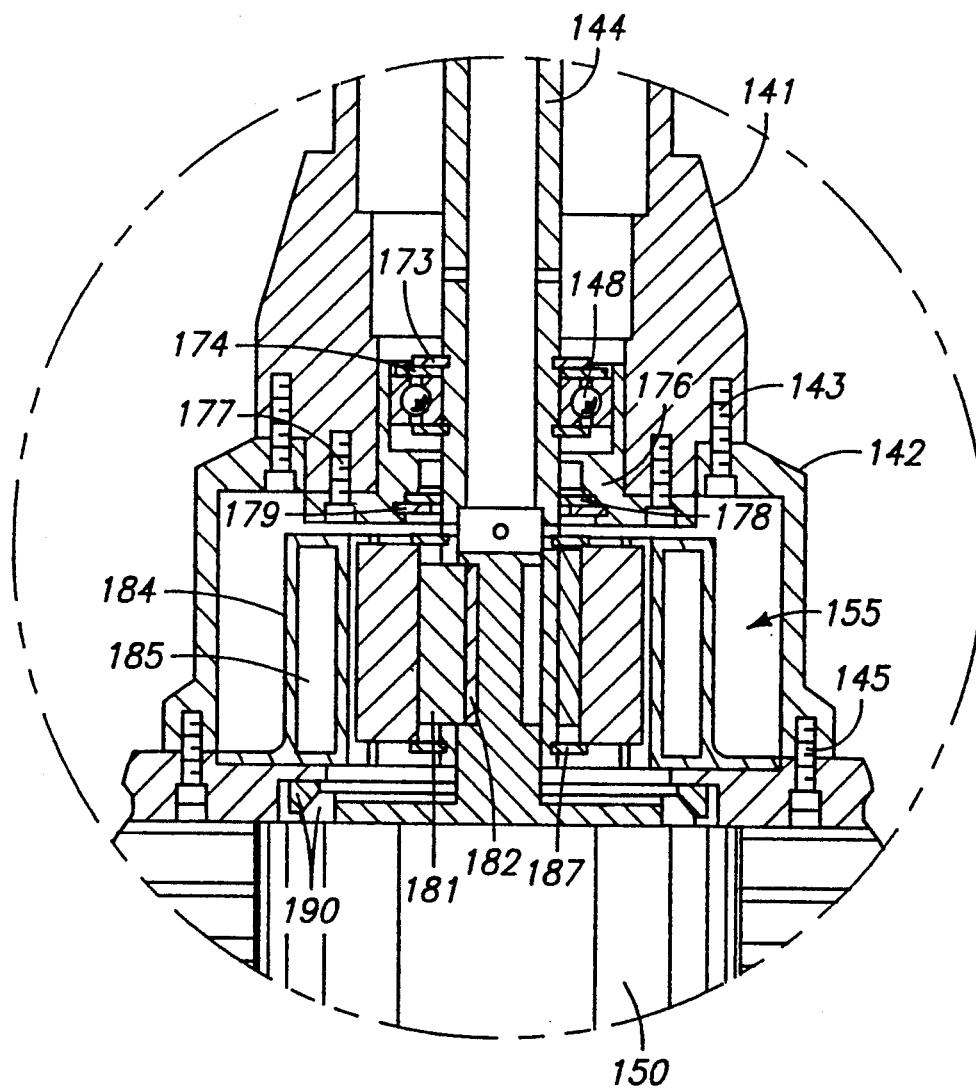

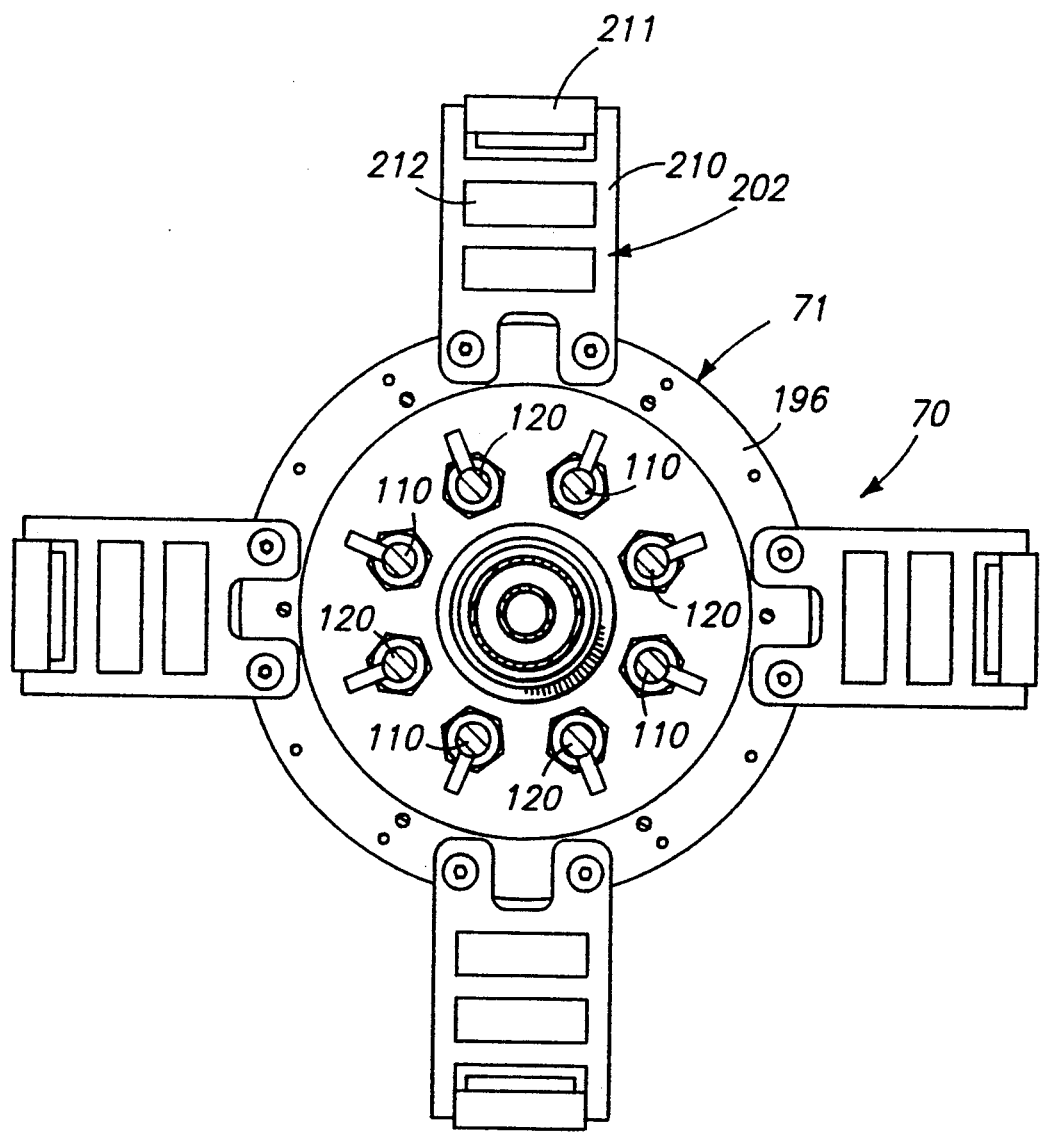

CENTRIFUGAL WAFER CARRIER CLEANING APPARATUS

TECHNICAL FIELD

The technical field of this invention is cleaning apparatus for rinsing and drying carriers used to hold and process semiconductor wafers, substrates, flat panel displays and similar articles requiring extremely low contamination levels.

BACKGROUND OF THE INVENTION

The processing of semiconductor wafers and substrates is very sensitive to problems of contamination. This is also true with photomasks, flat panel displays, data disks, and other articles relating to the semiconductor industry. These articles require extremely low contamination levels. Even minute contaminants can cause defects to occur in the processing of these low-contamination wafer articles. Accordingly, it is necessary to maintain a high level of cleanliness during all or nearly all stages of production.

Semiconductor wafers, substrates, photomasks, flat panel displays and other similar low-contamination wafer products are also typically processed in batches. Batch handling may occur throughout the entire production process, or for one or more processing steps or related handling operations. Batch processing of this type almost always utilizes some type of carrier or carriers to hold the thin wafer-like materials being processed.

In the batch processing of semiconductor substrates and wafers, a wafer carrier is used to hold a group of these articles. The wafer carriers can be of various designs and are more specifically referred to as a wafer boat. In many applications the wafer boat is made of a suitable polymeric material, e.g. polypropylene or TEFLON ® fluoropolymer. The sides and sometimes the bottom of the wafer boat have receiving slots formed to receive and positionally restrain the wafers in a spaced array with the faces of the wafers adjacent one another. Typically, the central axes of the wafers are aligned. The wafers are slid into the boat, such as from the side or above and removed by sliding them outwardly. The receiving slots in the wafer boat are shallow so that the wafer is engaged only at the peripheral edges and along a thin marginal band extending inwardly from the periphery.

Wafer carriers can also be provided in the form of a protective case or box in which the wafers are held and enclosed against contamination during travel within the processing facility. Wafer carriers of this type are frequently designed to hold a wafer boat having a complementary design. The complementary relationship of the protective wafer carrier box and the wafer carrier boat allow the boat and supported wafers to be fully enclosed and positionally restrained in all directions during transport.

The manufacture of wafer carriers also includes their cleaning. Cleaning of wafer carrying boxes and wafer carrying boats is difficult because they typically have features which include slots, grooves or apertures which are difficult to fully clean. This is greatly exacerbated by the extremely low contamination levels which can be accepted for articles used directly or indirectly in processing of the wafer articles. Dust, metal particles, oils and other organic chemicals may be present on the surfaces of the molds or other production tools used to make wafer carriers. Fully cleaning the wafer carriers to the required extremely low contamination levels is also difficult. Cleaning the wafer carriers for use in semiconductor processing is a task which in some cases is almost as difficult as mechanically forming the article.

The cleaning of wafer carriers has until this invention remained a difficult and relatively costly procedure. The current invention has several advantages and benefits which are explained or otherwise indicated herein.

BRIEF DESCRIPTION OF THE DRAWINGS

One or more preferred forms of the invention are described herein with reference to the accompanying drawings. The drawings are briefly described below.

FIG. 5 is a top view of the apparatus shown in FIG. 1.

FIG. 6 is a rear elevational view of the apparatus shown in FIG. 1 with portions removed for purposes of illustration.

FIG. 7 is an additional rear elevational view of the apparatus shown in FIG. 1 with further portions removed for purposes of illustration.

FIG. 8 is a longitudinal sectional view of selected portions of the apparatus of FIG. 1 showing the rotor and drive construction.

FIG. 8B is a longitudinal sectional view showing a portion of FIG. 8 in greater detail.

FIG. 9 is a cross sectional view taken along line 9—9 of FIG. 7.

DETAILED DESCRIPTION OF THE PREFERRED EMBODIMENTS

The disclosure of the invention is submitted in furtherance of the constitutional purposes of the U.S. Patent Laws "to promote the progress of science and useful arts" (Article 1, Section 8).

Figure 1:
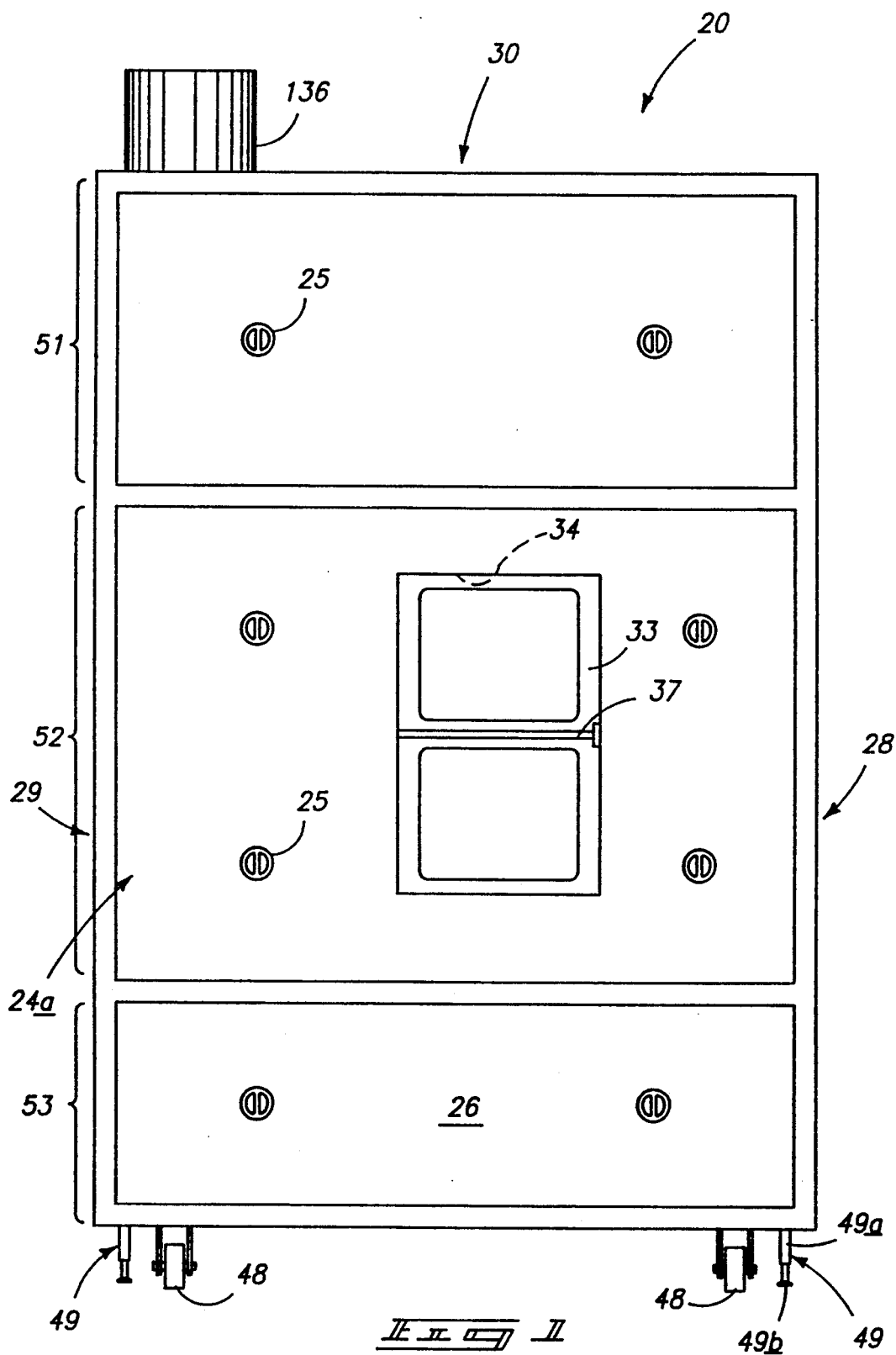
FIG. 1 is a front elevational view of a preferred embodiment of cleaning apparatus according to the current invention.

FIG. 1 shows a preferred centrifugal wafer carrier cleaning apparatus 20 according to this invention. Apparatus 20 includes a processing bowl or vessel 21 and a frame 22. Frame 22 has a number of frame members 23 which run both vertically and horizontally and are joined together to form an assembly which acts as the structural framework of apparatus 20. External finish panels 24 are detachably mounted between the frame members using suitable fasteners. As shown the finish panels are adapted for convenient detachment and reinstallation using a panel mounting system. The panel mounting system advantageously includes panel latch assemblies which utilize latch activators 25 to controllably latch and unlatch the finish panels. The latch activators 25 are connected mechanically to latch pins (not shown) which engage with the frame members 23 at suitable locations. The finish panels can be temporarily removed to allow maintenance upon internal components. The assembly of frame 22 and finish panels 24 in combination form the exterior or outer surfaces of cleaning apparatus 20.

Figure 2:
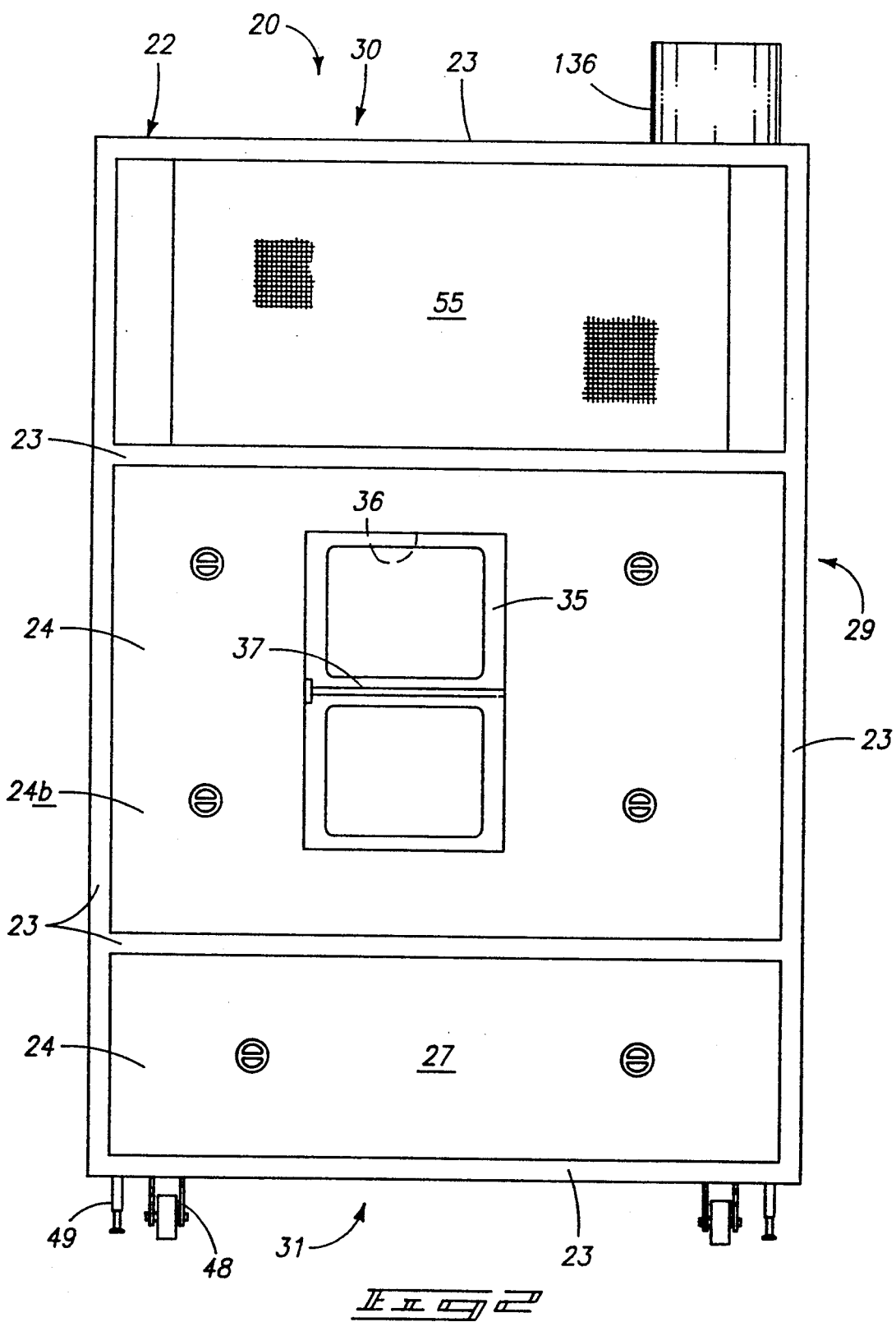
FIG. 2 is a rear elevation view of the apparatus shown in FIG. 1.
Figure 3:
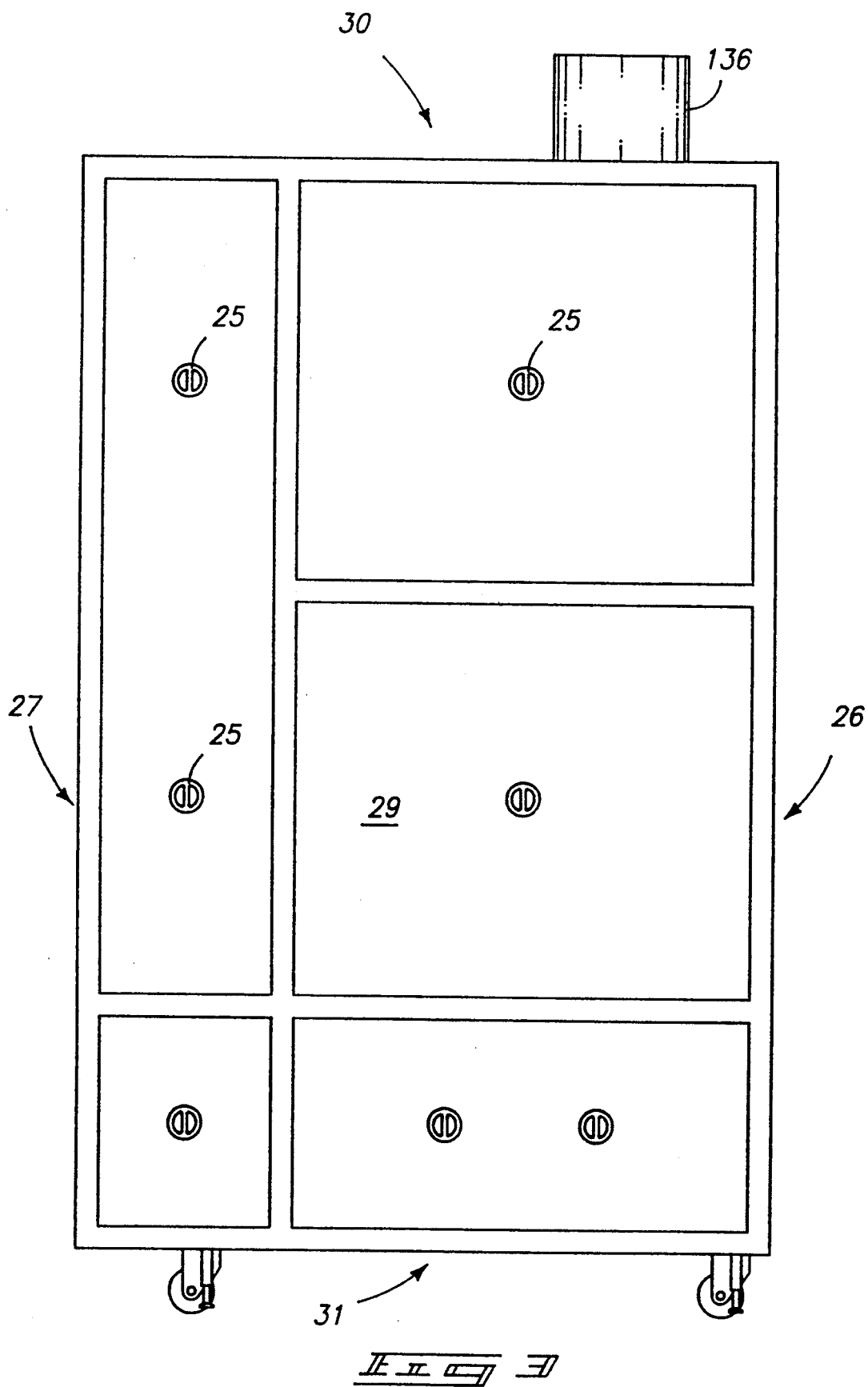
FIG. 3 is a left side elevational view of the apparatus shown in FIG. 1.

Wafer carrier cleaning apparatus 20 includes a front side 26, rear side 27, right side 28, left side 29, top side 30, and bottom side 31. Front side 26 has an associated entrance closure or first door 33 which is controllable to open and close a first opening or entrance port 34 formed in the sidewall of processing vessel or bowl 21. Rear side 27 has an associated exit closure or second door 35 which is controllable to open and close a second opening or exit port 35 which is also formed in the sidewall of processing bowl 21. FIGS. 1 and 2 show doors 33 and 35 in fully closed positions wherein the entrance and exit ports 34 and 36 are closed and substantially sealed shut to prevent fluid leakage.

Figure 12:
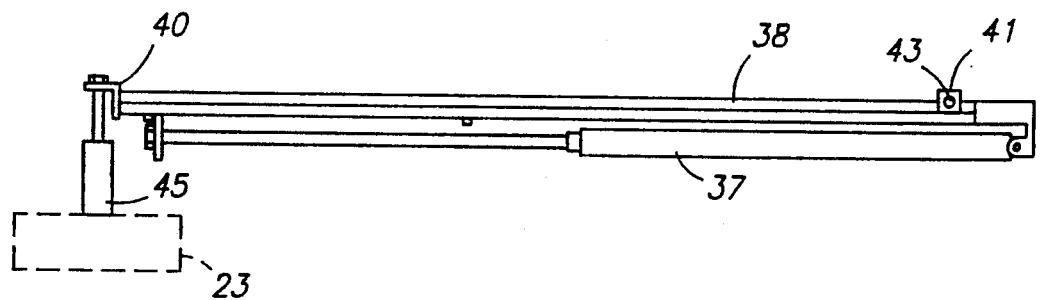
FIG. 12 is a detail top view showing in isolation a preferred door construction used in the apparatus of FIG. 1.
Figure 13:
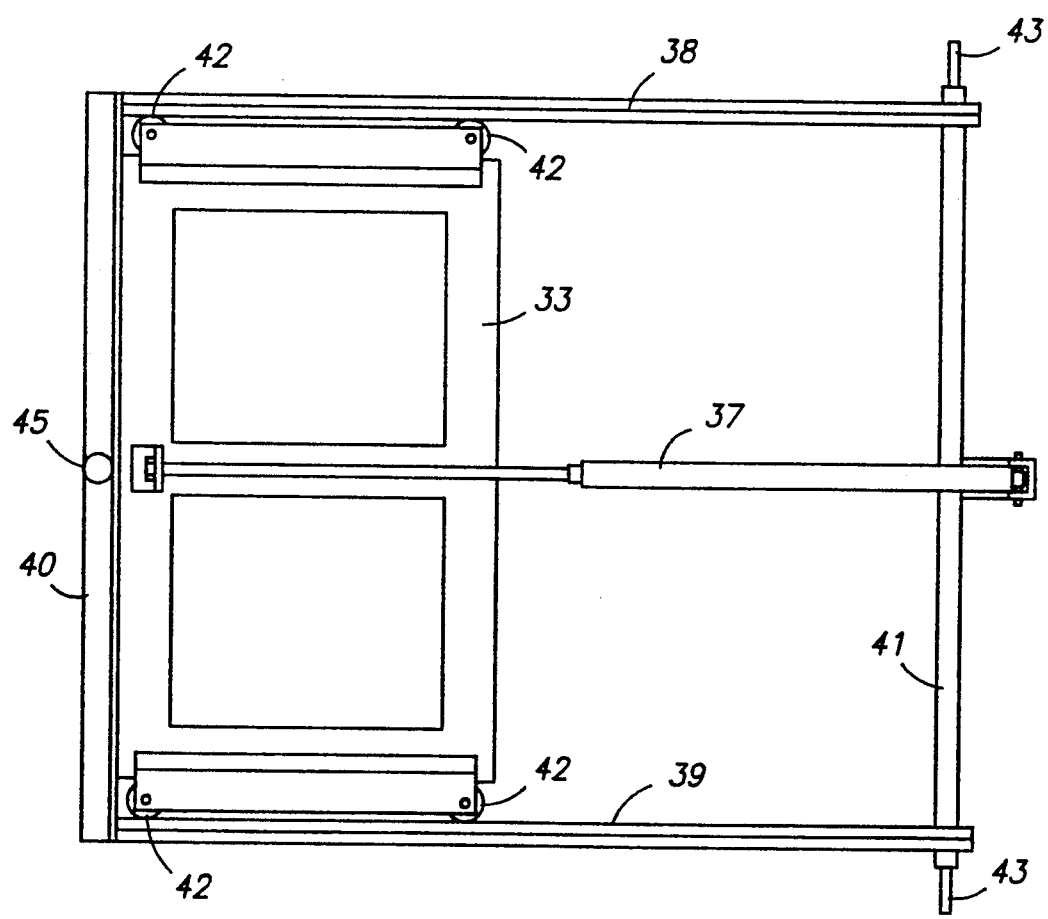
FIG. 13 is a detail front view showing in isolation the preferred door construction of FIG. 12.

FIG. 13 shows that doors 33 and 35 are preferably supported upon a door support structure having upper and lower guides 38 and 39. Guides 38 and 39 are advantageously connected to inner and outer vertical connection bars 41 and 40. The inner connection bar 41 has journal extensions 43 which are supported in bearing blocks 44 (see FIG. 6) mounted upon frame 22. The door support structures for doors 33 and 35 are mounted behind the adjacent central finishing panels 24a and 24b. The corners of doors 33 and 35 are provided with rollers 42 which roll upon the guides 38 and 39. Doors 33 and 35 are preferably operated relative to the door support structures by pneumatic rams 37. The door support structures and doors are pivoted inwardly to seal against the peripheral flange of the entrance and exit ports. This is done by controllably pivoting the door support structures using a door pivot actuator 45 which is advantageously a pneumatic ram extending between the outer vertical bar 40 and an adjacent frame member 23 (shown in phantom in FIG. 12).

The door is operated in the following manner. The pivot actuator 45 is maintained in an extended position until the door 33 has been fully extended toward the outer vertical bar 40. The pivot actuator is then operated to retract the door and support assembly formed by the door and door support structure. Conversely, when opening the door the pivot actuator is first extended to move the door and support assembly outwardly from the processing bowl 21. Thereafter the door is rolled upon the guides 38 and 39 are retracted toward the inner vertical bar 41.

The bottom 31 of apparatus 20 is advantageously provided with a set of casters 48 which are connected to the frame 22 near the bottom corners. The bottom corners of apparatus 20 are also preferably fitted with extendible and retractable stabilizers 49. The stabilizers have a fixed upper part 49a which is connected to the frame. A lower extendible part 49b is adjusted relative to the upper part. Apparatus 20 can thus be rolled to a suitable location. Thereafter the stabilizers can be extended to transfer the weight of the apparatus from casters 48 to the stabilizers and provide increased stability.

FIG. 1 shows that the wafer carrier cleaning apparatus 20 includes three sections 51-53; herein termed the upper of first section 51, the middle or second section 52, and the lower or third section 53. The upper or first section 51 includes a primary drying gas treatment system. The primary drying gas treatment system includes a suitable primary drying gas filter 55 shown in FIG. 2. Filter 55 is received within the outer portions of the drying gas plenum 57. FIG. 6 shows that the preferred construction of the plenum includes a filter stop 67 which extends about the interior of the plenum adjacent to but spaced inwardly from the filter opening 58. The filter 55 is installed within the plenum and is in part retained by the filter stop 67. Two connection brackets 68 are advantageously included at the sides of filter opening 58 to assist in mounting a finishing panel which also serves to support the outer face of the filter and keep the filter in the installed position.

In a typical installation the exit or rear side 27 of the apparatus is within a clean room or similar low contamination environment. Air can be pulled from the clean room and through the filter 55. Filter 55 is preferably a HEPA type or other suitable filter capable of removing very small particulate matter with great effectiveness. Filter 55 is constructed with a relatively large surface area to minimize pressure drop associated with moving air or other drying gas therethrough. This is helpful in eliminating the need for a specific, dedicated drying air fan which would otherwise increase particulate contamination. Contamination could occur to the primary drying gas flow path if a specific, dedicated drying gas fan was included therein. Such a hypothetical construction could also lead to contamination to the interior processing chamber 47 of vessel 21. Primary drying gas passes through the processing chamber to remove moisture therefrom. A hypothetical fan and associated drive motor which is specifically functions to move primary drying air or other drying gas also generates significant amounts of general contamination within or adjacent to the wafer carrier cleaning apparatus. This general contamination outside the processing vessel 21 nonetheless causes particulate matter to enter the processing chamber and prevents the very low contamination levels needed in the processing of semiconductor and other low-contamination wafer products.

FIG. 6 shows that the upper section 51 of the wafer carrier cleaning apparatus also preferably includes a drying gas heater 56. Drying gas heater 56 is mounted within a primary drying gas plenum 57. Plenum 57 serves as a drying gas enclosure and conduit. Air or other drying gas is passed through filter 55. Filter 55 is mounted within a plenum intake opening 58 which is substantially the entire side of the plenum. Filtered air received within the plenum passes about heater 56. Air within the plenum also passes down through a central heater opening 61 which extends through the lower section 62 of the heater. Heater 56 also has an upper section 59 which is provided with a cover that encloses wiring connections and mounts for an array of spaced parallel electrical resistance heating elements 60 mounted within the lower section of the heater and across the central opening 61. Each heating element 60 is preferably provided with a multitude of fins to improve heat transfer to the air or other primary drying gas passed thereover.

Air passes down through the central heater opening 61 and from the plenum through a plenum exhaust opening 63 in the central bottom of the plenum. The plenum exhaust opening is open to a processing bowl top port 65 (FIG. 7). Opening 63 and top port 65 allow communication of filtered, heated drying gas from the plenum into the processing vessel at a position substantially aligned with the central axis of the processing chamber and the rotational and longitudinal axis of rotor 70.

The primary drying gas plenum 57 is also preferably provided with a static electricity suppressor 66. Static suppressor 66 can be selected from suitable types of commercially known units. It preferably has exposed electrodes which are charged to desired electrical potentials to help neutralize static electricity generated by movement of drying gas through plenum 57 and over associated surfaces of the plenum and enclosed heater 56. The particular operating parameters used may vary dependent upon environmental and climatic conditions.

FIG. 6 shows that the middle or second section 52 includes the processing vessel or bowl 21. The processing bowl 21 is mounted upon the frame 22 using suitable fasteners (not shown). Processing bowl 21 is roughly cylindrical having semicircular sidewall sections 72. The sidewall of the processing bowl is completed by two substantially flat panels 73 on the opposing front and rear sides. The first or entrance flat sidewall panel includes the first or entrance port 34. The exit or second flat sidewall panel includes the second or exit port 36. Both the entrance and exit ports are preferably built with port flanges 74 which are relatively thicker than the sidewall panels 73 to strengthen the vessel and provide surfaces against which the doors 33 and 35 can seal. FIG. 6 has been simplified by not showing the rotor assembly 70 through the port 74. The details of the rotor and other internals of the processing bowl are described in connection with FIG. 7.

FIG. 7 shows that the processing bowl also has a top wall 76. The top wall is most preferably a relatively low flat frustoconical shape. The top wall has the top port 65 which serves as a primary drying gas supply formed therethrough. Port 65 thus provides an inlet to primary drying gas flowing from the plenum 57 into the processing chamber 47.

The processing bowl also has a bottom wall which is of composite construction. FIG. 8 illustrates specifics of the preferred construction. The first part of the bottom wall is an outer bottom wall piece 77 which is annular and connects to the lower edges of the processing bowl sidewall sections 72 and 73. The central portion of the bottom wall is open to provide a construction which accommodates inherent vibration of the rotating assembly and associated drive which will be described in greater detail hereinafter. This construction utilizes a flexible membrane or diaphragm 78 which is annular and extends inwardly from the inner edge of an annular outer bottom wall piece 77. The outer edge of the annular diaphragm 78 is captured between the outer bottom wall piece 77 and an outer diaphragm retaining ring 79 which is connected thereto using suitable fasteners. The inner edge of diaphragm 78 is raised relative to the outer edge, and is connected to a drive mount base plate 80. A diaphragm inner edge retaining ring 81 is connected by fasteners below the base plate 80 to capture diaphragm 78 therebetween.

The processing chamber 47 is also most preferably provided with a false bottom or bottom baffle 85. The bottom baffle is sized to provide a space between its outer periphery and the inside surfaces of the processing bowl sidewalls. This annular exhaust and drain baffle space allows exhausting gas and draining liquids to flow across and down about the outside of the baffle. Bottom baffle 85 is most preferably constructed using two baffle parts, an upper or first baffle part 86, and a lower or second baffle part 87. The upper baffle part is flat, or more preferably, slightly crowned to drain liquids which fall thereon. The lower baffle part 87 is frustoconical expanding upwardly to connect with and support the peripheral edge of the upper baffle part 86. The bottom baffle assembly 85 is supported upon baffle mounting brackets 88 which extend upwardly from the outer bottom wall 77 to connect with the lower baffle part 87.

The processing vessel 21 is preferably fitted with at least one outer spray manifold 90. Outer spray manifolds 90 are connected directly to the sidewalls 72. External spray manifold supply fittings 91 connect with liquid supply conduits 92. As shown, processing chamber is advantageously provided with four (4) outer spray manifolds 90 at spaced approximately equiangular points about the central axis of the processing chamber. The outer spray manifolds are provided with a plurality of liquid spray nozzles 93. Spray nozzles 93 are directed inwardly to spray water, water and detergent, solvents; mixtures thereof, or other cleaning liquids generally inward or directly toward the central axis of the processing chamber.

FIG. 7 shows that the processing vessel 21 is also preferably fitted with at least one outer drying gas manifold 100. Outer drying gas manifolds 100 are similar to outer cleaning liquid spray manifolds 90 in basic construction and mounting to the processing vessel sidewall 72. The outer drying gas manifolds are supplied with a suitable pressurized secondary drying gas through supply fittings 101 mounted in the sidewall 72. The supply fittings 101 (see FIG. 6) are connected to secondary drying gas supply conduits 102. These conduits are supplied with a suitable secondary drying gas, such as clean dry air or nitrogen. The drying gas manifolds have gas nozzles or jets 103. Jets 103 are inwardly directed to provide streams of secondary drying gas which impinge upon the wafer carriers being dried. As shown, there are four (4) outer secondary drying gas manifolds 100 which are spaced approximately equiangularly about the processing chamber. The gas manifolds and spray manifolds are advantageously arranged in alternating sequence about the diameter of the circular outer manifold array formed by manifolds 90 and 100.

FIGS. 7 and 9 also indicate that processing chamber 47 is preferably provided with a number of inner liquid spray manifolds 110 and inner secondary drying gas manifolds 120. The function of manifolds 110 is to spray cleaning and rinsing liquid(s) at wafer carriers mounted upon the rotor 70. The inner spray manifolds are mounted in a circular array at approximately equiangularly spaced positions, as shown in FIG. 9. The inner liquid spray manifolds are mounted to the bottom baffle 85 and extend upwardly at radial positions which are within the cage 71 of rotor 70. The wafer carriers being cleaned and dried are mounted upon the rotor cage 71, in a suitable manner, such as indicated below. The inner liquid spray manifolds 110 are provided with a plurality of nozzles 113 mounted upon the manifolds at spaced vertical locations. The nozzles are directed in a generally outward or radial direction toward the rotor cage.

FIG. 9 shows an array of inner secondary drying gas manifolds 120 interpositioned in an alternating pattern with the inner liquid spray manifolds 110. As shown there are four (4) manifolds 120 which are approximately equiangularly arranged about the central axis of the processing chamber and the rotational axis of rotor 70. Manifolds 120 have a plurality of vertically spaced nozzles or jets 123 arranged along the upstanding manifolds. The jets direct diverging streams of secondary drying gas in a generally outward direction toward the rotor cage 71 and against wafer carriers supported thereon. The drying gas is used to blow and evaporate any rinsing or washing liquids from the surfaces of the rotor and supported wafer carriers being cleaned.

Liquid supplied to spray manifolds 90 and 110 and secondary drying gas supplied to manifolds 100 and 120 are preferably controlled by an automatic controller (not shown) which operates electrical solenoid valves (not shown). The electrical solenoid valves control the flow of compressed air or other pneumatic control gas or other suitable fluid. The control gas is controllably delivered to pneumatically controlled solenoid valves which directly control the flow of cleaning liquids and drying gas to the manifolds 90 and 100. Manual cleaning fluid supply valves (not shown) and manual secondary drying gas valves (not shown) are also connected in parallel with the pneumatically controlled valves to allow manual operation if desired.

Figure 4:
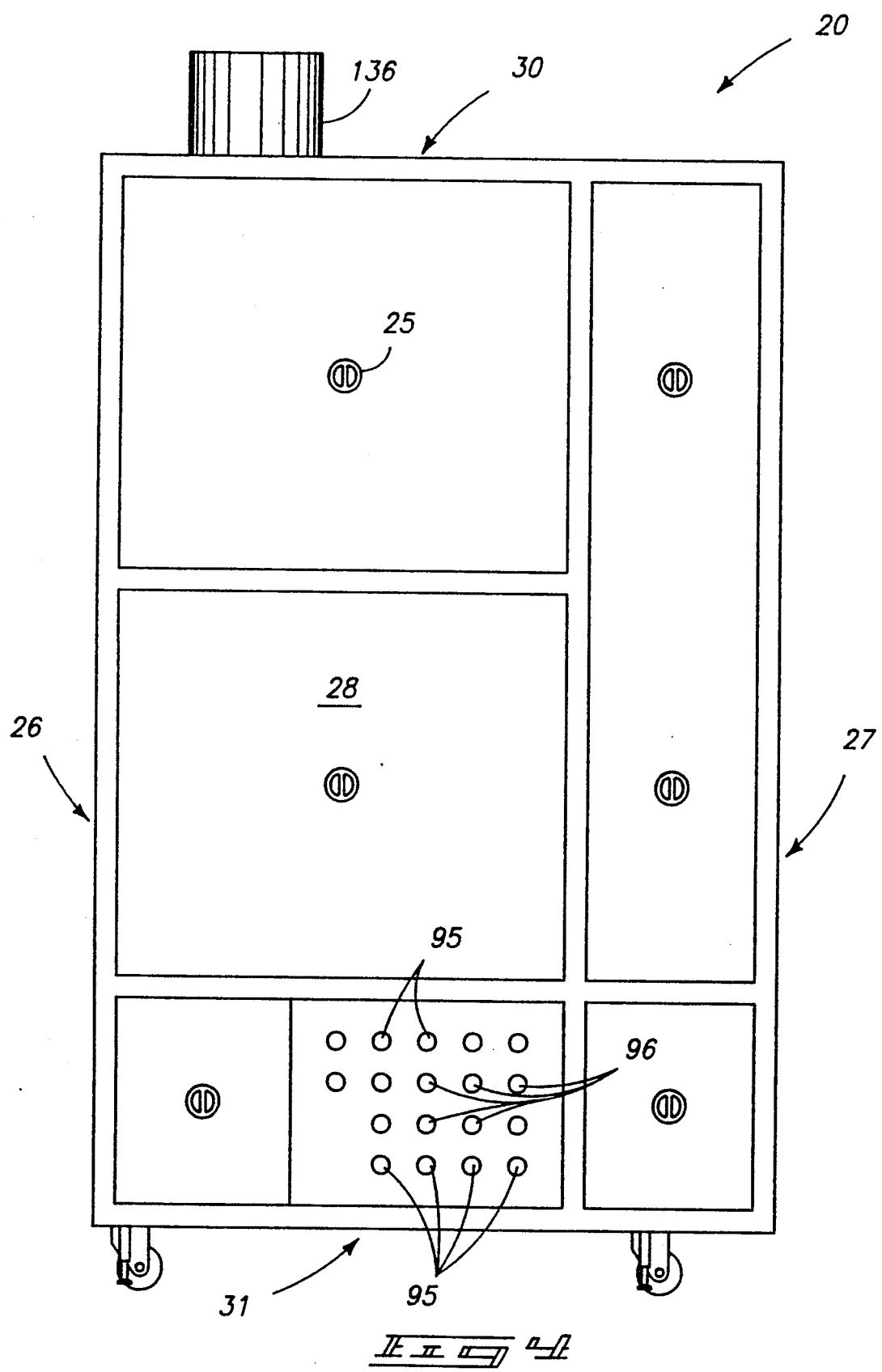
FIG. 4 is a right side elevational view of the apparatus shown in FIG. 1.

Pressure gauges 95 (see FIG. 4) are advantageously used to provide an indication of the pressures to the spray and gas manifolds. Associated pressure regulator valves 96 are also included to allow manual regulation of the delivery pressures to the manifolds.

The processing vessel 21 is also provided with a suitable means for draining liquids therefrom. It is further provided with a suitable means for exhausting the drying gases. As shown, wafer carrier cleaning apparatus 20 includes a liquid drain and gas exhaust subsystem 130 which in part combines these functions. The drain and exhaust subsystem 130 includes an outflow box 131. Outflow box 131 is mounted beneath the bottom wall of the processing bowl 57. The outer bottom wall piece 77 has a processing chamber outflow opening or port formed therethrough adjacent to the outflow box. Liquids drain across the bottom wall of the processing bowl and into the outflow box. Gases flow from the processing chamber through the outflow port and into the outflow box 131. The bottom of the outflow box is sloped toward a central trough and a liquid outflow drain opening 134. A liquid drain line or conduit 133 extends from the drain opening 134 and carries liquids draining from the processing chamber to a suitable facilities drain pipe or sewer.

The outflow box 131 also has a gas exhaust port 135 which passes exhausting gases from the outflow box into a suitable gas exhaust conduit. As shown, the gas exhaust conduit is in the form of an upstanding exhaust gas stack 136. Exhaust stack 136 is connected to a suitable facilities exhaust system to remove the gas and contained liquid vapors removed from the processing chamber.

FIG. 7 shows portions of a rotating assembly which includes the rotor 70 with attached rotor cage 71. The rotor is supported in an upright position by a rotor housing 140. Rotor housing 140 is mounted upon base plate 80. Base plate 80 is supported upon frame drive assembly mounting members 23a which extend in a generally front-to-back orientation. Members 23a are a weldment subframe which attaches to the frame 22. This is advantageously accomplished using a drive to the frame 22. This is advantageously accomplished using a drive assembly mounting ring 82 which is bolted to members 23a. Elastic mounting bushings 83 are interpositioned between the base plate and mounting ring 82 to accommodate vibration and shock. Fasteners 84 extend through apertures in fastener caps 89, ring 82, bushings 83 and base plate 80, to secure the base plate to the frame in a manner suitable for dissipating vibration and shock.

A drive motor 150 is mounted beneath the base plate 80 to drive the rotating assembly. Motor 150 extends downwardly into the lower or third section 53 of the wafer carrier cleaning apparatus. Motor 150 is preferably a brushless direct current type electrical motor to prevent particulate contamination associated with contacting electrical brush type motors. The motor is positioned by complementary tapered alignment rings 190.

Figure 8A:
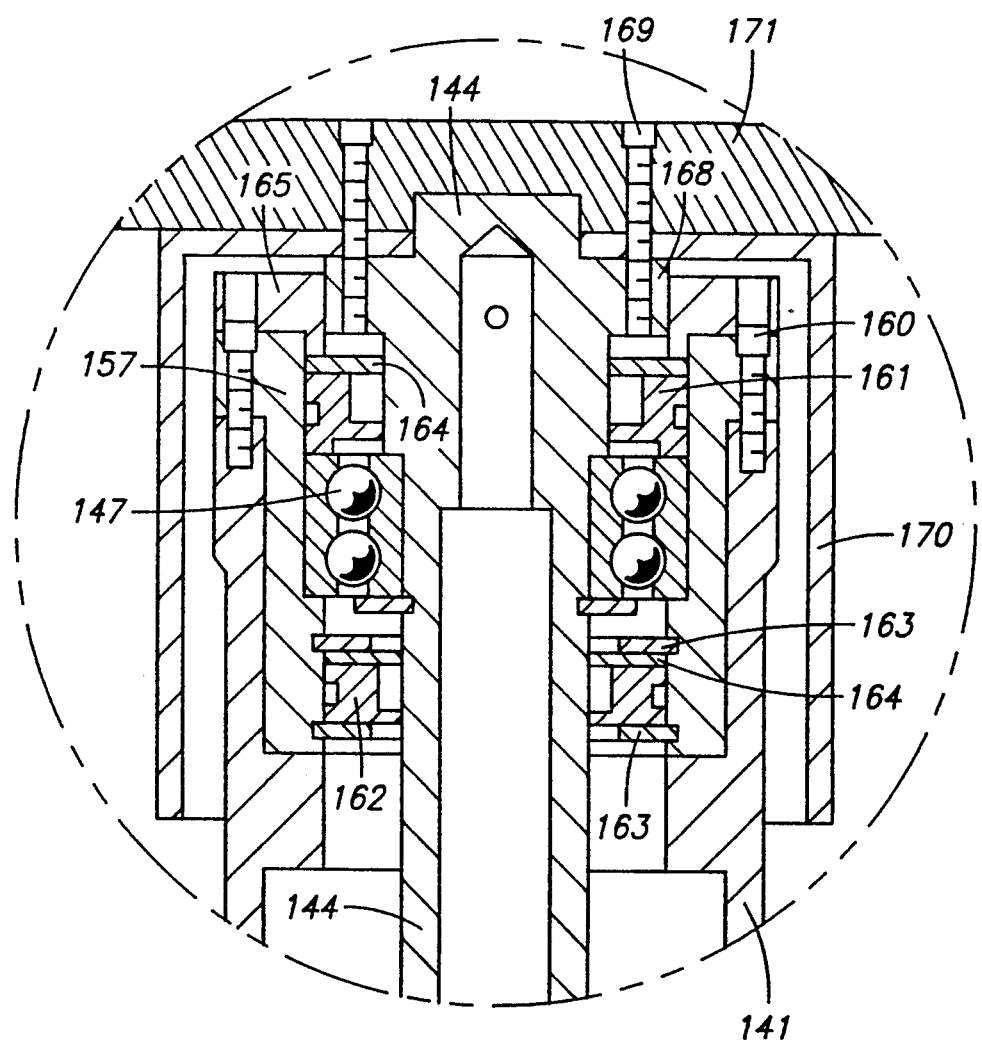
FIG. 8A is a longitudinal sectional view showing a portion of FIG. 8 in greater detail.

FIGS. 8, 8a and 8b show in sectional view the rotor, rotor housing, and drive components in greater detail. Rotor 70 includes a rotor shaft 144. Rotor shaft 144 is mounted for rotation within the rotor housing 140. The rotor housing includes an upper or first housing piece 141 and a lower or second housing piece 142. The first and second housing pieces are connected by a series of fasteners 143. The rotor housing 140 is connected to the base plate 80 using fasteners 145. The lower second rotor housing also functions as a housing which encloses a brake assembly 155.

FIGS. 8 and 8A show that rotor 70 is mounted for rotation within the upper rotor housing 141 using an upper or first bearing 147 and a lower or second bearing 148. The upper bearing is advantageously a double ball bearing with the outer race of the bearing positioned within an upper rotor bearing mounting sleeve 157. The mounting sleeve 157 is held by fasteners 160 to the upper, distal end of rotor support housing piece 141. Mounting sleeve 157 also holds bearing seals 161 and 162 which seal the bearing area to retain lubricant and prevent migration of particulates generated by the bearings. The first upper rotor bearing seal 161 is captured in position between the outer race of bearing 147 and a retainer ring 165 held by fasteners 160. A shield 166 is also advantageously included to protect seal 161. The second upper rotor bearing seal 162 is held in position using two spring retainer rings 163 on both sides thereof. A suitable shield 164 is also advantageously used.

FIG. 8A also shows that the upper distal end of rotor shaft 144 is preferably provided with a flange 168 having mounting apertures which receive bolts 169. A splash shield or cap 170 is held between the rotor wheel 171 and flange 168 using bolts 169. The shield cap 170 and rotor wheel 171 rotate with shaft 144.

FIGS. 8 and 8B show the lower rotor bearing mounting arrangement and adjacent components. Lower bearing 148 is of a type suitable to support most of the thrust loading caused by the weight of the rotating assembly. Spherical contact self-aligning ball bearings are suitable. The inner rotating race of bearing 148 is held in position upon shaft 144 using spring ring retainers 173. A bearing shield 174 is held in position above bearing 148. The outer race of bearing 148 is held within a lower rotor bearing mounting sleeve 176. Mounting sleeve 176 is connected to the lower or proximate end of rotor housing piece 141 using fasteners 177. Mounting sleeve 176 also mounts a shaft seal 178 using a spring retainer ring 179.

The drive assembly also preferably includes a rotating assembly brake 155. The brake assembly 155 is enclosed within the lower or second rotor housing piece 142. The brake includes a rotating cylindrical brake part 181 which is secured to the rotor shaft 144 and motor output shaft 151 using a key 182 and two opposing spring retainer rings 187. The outer periphery of the rotating cylindrical brake part 181 is contacted by a series of brake contact pads 183. The brake contact pads 183 line the interior face of a cylindrical annulus which serves as a brake actuator 184. Brake actuator 184 is elastically deformable and is inflated by supplying pressurized fluid to the internal expansion chamber 185. When inflated the contact pads are moved inwardly to rub against the outer face of the rotating brake part or drum 181. The rotating assembly can be controllably stopped using the brake system 155. This is important in slowing the rotating assembly and in stopping the rotating assembly in a suitable position for loading and unloading wafer carriers. The rotating assembly is freed to rotate by relieving the pressure within chamber 185.

The rotating assembly also includes a rotor wheel 171 which is mounted to the upper distal end of the upstanding rotor shaft 144. Rotor wheel 171 has a peripheral ring 192 which is connected to a hub 194 using a plurality of spokes 193. The spaces between the spokes are open to facilitate a downward flow of primary drying gas from the primary drying gas inlet port 65 into the space within the interior of rotor cage 71.

The rotor wheel supports the rotor cage 71. The rotor cage includes a number of peripheral rings 196. The uppermost peripheral cage ring is advantageously formed by peripheral ring 192 of rotor wheel 171. The cage also includes a number of longitudinal connection bars 197 which extend between the cage rings 196. Reinforcement pieces 198 connect between the rotor wheel and cage to add strength and they also provide addition blade area for moving drying gas as the rotor turns.

The rotary motion of the rotor wheel and rotor cage cause centrifugal action of the drying gas and thereby induces a flow of gas. The flow of drying gas is generally downward into the interior of the rotor cage, and then outward toward the peripheral sidewalls of the processing vessel. The bottom baffle 85 is spaced inwardly from the processing vessel sidewalls leaving an annular flow space thereabout. The centrifugal action of the rotor thus induces an outward flow which proceeds outwardly and downwardly to form a downwash which exits through the annular opening about the bottom baffle. Beneath the bottom baffle the gas flow proceeds across the bottom wall of the processing vessel toward the drain and exhaust box 131. This construction maintains a relatively controlled drying gas flow path which carries liquid vapors from the processing chamber and minimizes turbulence and complex gas flows near the bottom of the chamber which otherwise will occur and derogate the particle counts exhibited by the wafer carriers processed through the cleaning apparatus 20.

Figure 10:
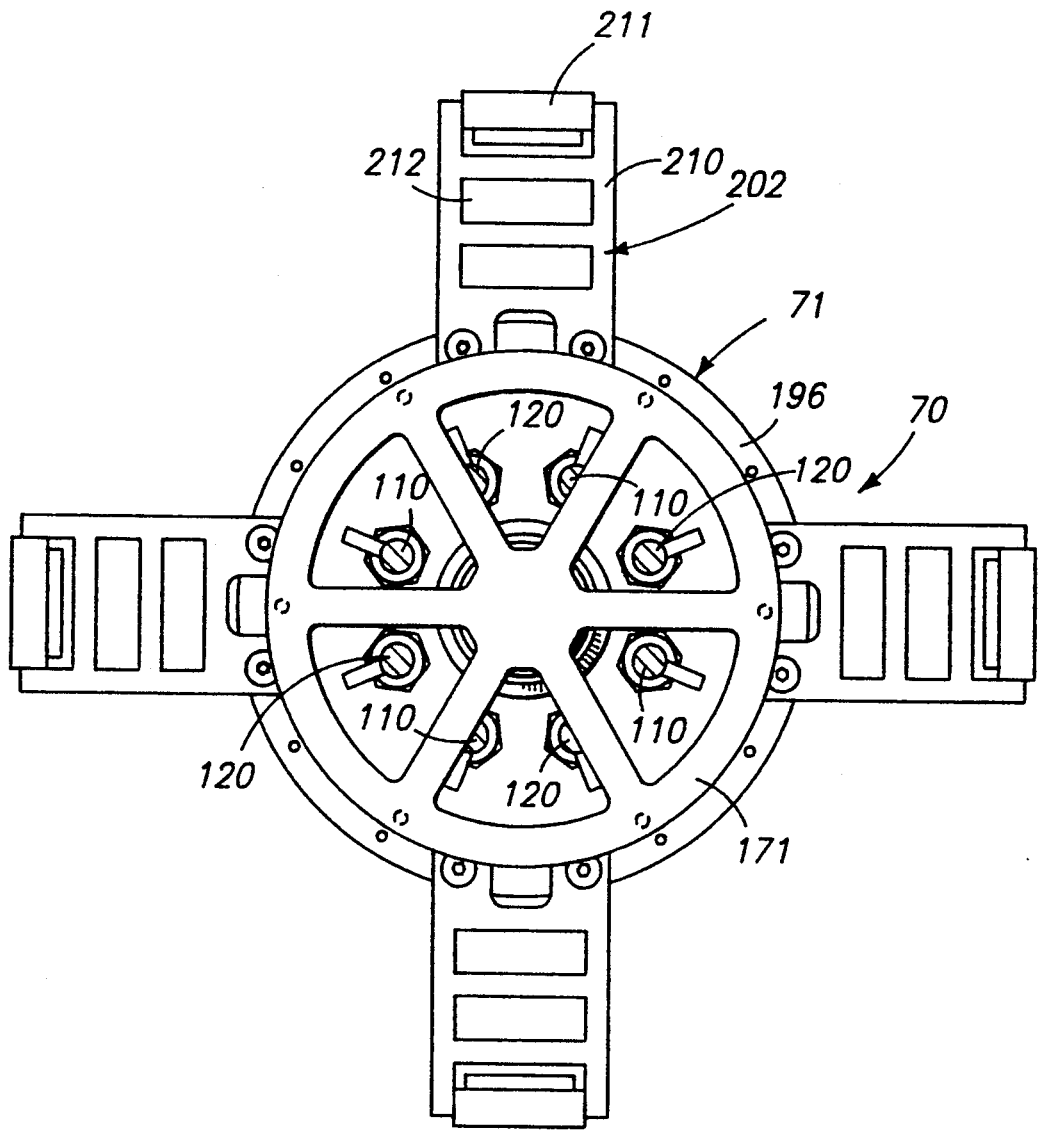
FIG. 10 is a top view of the rotor shown in isolation.
Figure 11:
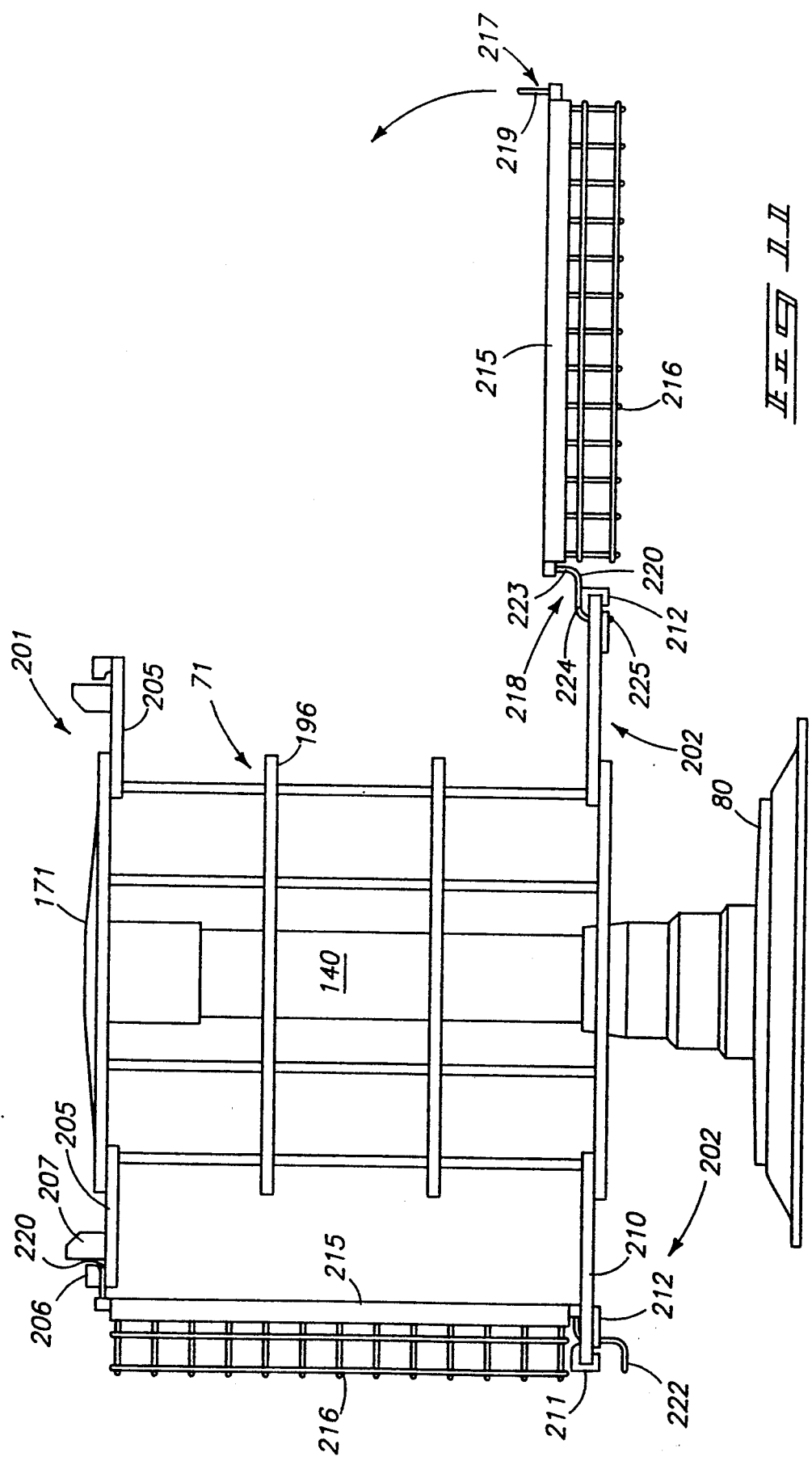
FIG. 11 is a side view illustrating a preferred wafer carrier support construction used in the apparatus of FIG. 1 shown in isolation with the rotor assembly.

FIGS. 9-11 show a preferred construction providing wafer carrier supports 200 which hold wafer carriers in position for cleaning within apparatus 20. As shown there are four (4) wafer carrier supports 200 at spaced, approximately equiangular positions about rotor cage 71. The wafer carrier supports include an upper or first mounting bracket 201 and a lower or second mounting bracket 202. The mounting brackets are secured to the rotor cage rings 196 using suitable fasteners 203. The upper wafer carrier mounting brackets include a main bracket piece 205. Connected thereto are an outer retaining lug 206 and an inner stop piece 207, both of which are advantageously made of nylon or other suitable polymer material. The lower mounting brackets 203 include a main bracket piece 210 which mounts an outer roll bar 211 and an inner rest piece 212.

The wafer carrier supports further include a detachable wafer carrier support basket 214. Wafer carrier support baskets 214 have a perimetric frame 215 and a reticulated basket 216. The baskets have an opening defined by the perimetric frame with the basket extending outwardly to form a wafer carrier storage space therewithin. The wafer carriers are held along the inwardly directed side of the basket 216.

The wafer carrier supports are provided with bracket engaging ends 217 and 218. The first or upper bracket engagement end 217 is adapted to engage with the upper or first mounting bracket 201. The second or lower bracket engagement end 218 is adapted to engage with the lower or second mounting bracket 202. First bracket engagement end 217 has a first end engagement loop 219 which extends approximately perpendicular to the plane defined by the perimetric frame 215. Loop 219 is directed from the basket opening, or upwardly when the basket is laid flat and inwardly when installed upon the rotor. Loop 219 is lifted up and over outer retainer lug 206 and then lowered into the position shown at the left in FIG. 11. A retaining groove 220 is formed in the inward face of lug 206 in order to receive and retain the loop in position. Centrifugal action forces the loop into groove 220.

The second or lower bracket engagement end 218 has a loop 222 which extends in curved to form three different sections. The first section 223 is perpendicular to the plane of the basket opening. This first section extends in a direction along the end of the basket and opposite to the direction of the first loop 219. The second section 224 of loop 222 extends parallel to the plane of the basket opening and away from the basket. The first and second seconds are joined in a curve which bears upon a curved outer-upper corner of the lower bracket rest or support piece 212. Loop 222 also has a third section which is extends and is oriented similar to the first section 223. The second and third sections are joined by a curve which bears upon and rolls over the outer roll bar 211 as the basket is installed. The basket pictured at the right in FIG. 11 shows the starting position. The basket is then pivoted or rolled upwardly and lifted to allow the loop 219 to clear over the lug 206. The basket is then lowered or dropped into the installed position shown at the left in FIG. 11.

The wafer carrier cleaning apparatus is used to perform a wafer carrier cleaning process. The wafer carrier cleaning process begins by loading the wafer carriers into baskets 216. The entrance door 33 is then opened and the loaded baskets are installed upon the rotor through the entrance port 34. This is repeated until all wafer carrier supports have been loaded, preferably with loads having about the same weight. The operation then involves closing the entrance door using the actuating ram 38. The closing also involves sealing and the entrance door to the entrance port 34.

Thereafter the wafer carriers are subjected to a cleaning process which includes rotating the rotor and spraying the wafer carriers with water, solvent, detergent or other washing and cleaning liquid(s) supplied through the inner and outer liquid spray manifolds 110 and 90. The cleaning using liquid spraying and rotating steps is performed for sufficient time to adequately cleanse all surfaces of the wafer carriers being cleaned. The simultaneous spraying and rotating serves to direct the sprays of liquid from differing directions to enhance solubilization of dirt, grease and other contaminants which may be present upon the wafer carriers prior to cleaning.

After treating the wafer carriers with the cleaning liquids, a drying process is advantageously performed. The drying process includes supplying the drying gases to the processing chamber. The primary drying gas is supplied through plenum 57. This primary drying gas is treated by filtering the incoming air or other primary drying gas. Then the primary drying gas is treated by heating it to a desired temperature, such as in the range of 100° F. to 300° F., or higher dependent upon the materials from which the wafer carriers are constructed. The primary drying gas is also treated by dissipating static electricity using the static suppressor 66. The filter, heated, and static electricity dissipated primary drying gas is then used by supplying it to the processing chamber 47. The flow of primary drying gas is developed by inducing the flow by rotating the rotor. The centrifugal action of the rotor thus sucks primary drying gas through the filter, plenum and heater and into and through the processing chamber. The induced flow of primary drying gas performs a drying function upon the wafer carriers being rotated within the processing chamber.

The wafer carriers are also preferably subjected to drying by supplying pressurized secondary drying gas to the outer and inner drying gas manifolds 100 and 120. The drying operation is enhanced by streaming or jetting the drying gases toward the wafer carriers while rotating the wafer carriers loaded upon the rotor. This simultaneous rotating and jetting with drying gas helps to expose the interstices of the wafer carriers to the drying action of the secondary drying gas as well as the primary drying gas. The secondary drying gas can be clean dry air, nitrogen or other suitable drying gas supplies having low contamination and low vapor content thus enhancing the rate of drying a speeding the overall processing rate. The wafer carriers are subjected to both primary and secondary drying for sufficient time to effectuate a dry condition on all surfaces of the wafer carriers.

The wafer carriers are further processed by stopping the rotor and incrementally positioning the wafer carrier supports 200 adjacent to the exit port 36. After the first wafer carrier support is positioned adjacent to exit port 36, the process includes opening exit door 35 using door operator 37. The wafer carrier support is then removed from the rotor by lifting the upper loop 219 clear of lug 206 and pivoting the wafer carrier support downwardly into the loading position shown in FIG. 11 at the right. The wafer carriers can then either be removed from the basket or the entire wafer carrier support can be removed and unloaded elsewhere as deemed best.

It is further noteworthy that the wafer carriers are loaded from a relatively less clean room, sometimes called a "grey room". The cleansed units are unloaded into a clean room having very low propensity for contaminating the cleaned wafer carriers. Thus the wafer carrier cleaning apparatus is preferably installed so that the entrance door operates in the grey room environment and the exit door operates in the clean room environment.

The wafer carrier cleaning apparatus is constructed using known welding, machining and other forming operations to provide the components and assemblies described in detail hereinabove. The processing chamber bowl and other conduits which supply gas or liquids are preferably made of stainless steel. Structural components can be made of steel or other suitable materials.

In compliance with the statute, the invention has been described in language necessarily limited in its ability to properly convey the conceptual nature of the invention. Because of this inherent limitation of language, it must be understood that the invention is not necessarily limited to the specific features described, since the means herein disclosed comprise merely preferred forms of putting the invention into effect. The invention is, therefore, claimed in any of its forms or modifications within the proper scope of the appended claims appropriately interpreted in accordance with the doctrine of equivalents.

We claim:

1. A centrifugal cleaner for wafer carriers, comprising:
    a frame;
    a process chamber bowl supported upon the frame; said process chamber bowl defining a process chamber therewithin; said process chamber bowl further including an entrance port and an exit port; said entrance port being formed through the process chamber bowl to allow installation of wafer carriers into the process chamber therethrough; said exit port being formed through the process chamber bowl to allow removal of wafer carriers from the process chamber therethrough;
    an entrance door for controllably opening and closing said entrance port;
    an exit door for controllably opening and closing said exit port;
    a rotor mounted for rotation within the process chamber;
    a plurality of wafer carrier supports connected to said rotor for holding wafer carriers during centrifugal cleaning;
    rotor drive means for controllably rotating said rotor;
    at least one cleaning liquid spray manifold mounted within the process chamber for spraying a suitable cleaning liquid upon wafer carriers held in the wafer carrier supports;
    at least one drying gas supply for supplying drying gas to the process chamber to dry said cleaning liquid from wafer carriers.

2. A centrifugal cleaner for wafer according to claim 1 and wherein the rotor extends upwardly from lower portions of the processing chamber.

3. A centrifugal cleaner for wafer carriers according to claim 1 and wherein the rotor extends upwardly from lower portions of the processing chamber within a rotor support housing mounted within the processing chamber.

4. A centrifugal cleaner for wafer carriers according to claim 1 and wherein the rotor extends upwardly from lower portions of the processing chamber within a rotor support housing mounted within the processing chamber; said rotor also including a rotor wheel along upper portions thereof; said rotor further including a rotor cage which is mounted to said rotor wheel and extends downwardly to support said plurality of wafer carrier supports.

5. A centrifugal cleaner for wafer carriers according to claim 1 and wherein the rotor extends upwardly from lower portions of the processing chamber within a rotor support housing mounted within the processing chamber; said rotor also including a rotor wheel along upper portions thereof; said rotor further including a rotor cage which is mounted to said rotor wheel and extends downwardly; said at least one spray manifold including at least one inner spray manifold which extends upwardly within the processing chamber between the rotor cage and the rotor support housing.

6. A centrifugal cleaner for wafer carriers according to claim 1 and wherein the rotor extends upwardly from lower portions of the processing chamber within a rotor support housing mounted within the processing chamber; said rotor also including a rotor wheel along upper portions thereof; said rotor further including a rotor cage which is mounted to said rotor wheel and extends downwardly; and wherein there are a plurality of cleaning liquid spray manifolds; said spray manifolds including outer spray manifolds for spraying from outer positions inwardly toward wafer carriers held in the wafer carrier supports, and inner spray manifolds for spraying from inner positions outwardly toward wafer carriers held in the wafer carrier supports; said inner spray manifolds extending upwardly within the processing chamber between the rotor cage and the rotor support housing.

7. A centrifugal cleaner for wafer carriers according to claim 1 and wherein the rotor extends upwardly from lower portions of the processing chamber; said rotor further including a rotor cage to support said plurality of wafer carrier supports.

8. A centrifugal cleaner for wafer carriers according to claim 1 and wherein the rotor includes a rotor shaft which extends upwardly from lower portions of the processing chamber; said rotor further including a rotor cage having downwardly extending portions; said at least one spray manifold including at least one inner spray manifold which extends upwardly within the processing chamber between the rotor cage and the rotor shaft.

9. A centrifugal cleaner for wafer carriers according to claim 1 and wherein the rotor includes a rotor shaft which extends upwardly from lower portions of the processing chamber; said rotor further including a rotor cage having downwardly extending portions; and wherein there are a plurality of cleaning liquid spray manifolds; said spray manifolds including outer spray manifolds positioned outwardly from the rotor cage for spraying from outer positions inwardly toward wafer carriers held in the wafer carrier supports, and inner spray manifolds for spraying from inner positions outwardly toward wafer carriers held in the wafer carrier supports; said inner spray manifolds extending upwardly within the processing chamber between the rotor cage and the rotor shaft.

10. A centrifugal cleaner for wafer carriers according to claim 1 and further comprising at least one drying gas filter for filtering contaminants from drying gas supplied to the process chamber through said at least one drying gas supply.

11. A centrifugal cleaner for wafer carriers according to claim 1 and further comprising:
at least one drying gas filter for filtering contaminants from drying gas supplied to the process chamber through said at least one drying gas supply;
at least one drying gas heater for heating drying gas supplied to the process chamber through said at least one drying gas supply.

12. A centrifugal cleaner for wafer carriers according to claim 1 and further comprising:
a drying gas plenum;
at least one drying gas filter for filtering contaminants from drying gas supplied to said drying gas plenum;
at least one drying gas heater mounted to the drying gas plenum for heating filtered drying gas;
and wherein filtered, heated drying gas from said plenum is supplied to the process chamber through said at least one drying gas supply.

13. A centrifugal cleaner for wafer carriers according to claim 1 and wherein at least one drying gas supply is approximately aligned with the rotational axis of said rotor.

14. A centrifugal cleaner for wafer carriers according to claim 1 wherein there are a plurality of cleaning liquid spray manifolds.

15. A centrifugal cleaner for wafer carriers according to claim 1 and wherein there are a plurality of cleaning liquid spray manifolds; said spray manifolds including outer spray manifolds for spraying from outer positions inwardly toward wafer carriers held in the wafer carrier supports, and inner spray manifolds for spraying from inner positions outwardly toward wafer carriers held in the wafer carrier supports.

16. A centrifugal cleaner for wafer carriers according to claim 1 wherein there are a plurality of cleaning liquid spray manifolds; and further comprising a plurality of drying gas manifolds for jetting drying gas upon the wafer carrier supports and any wafer carriers held therein to aid in drying cleaning liquid therefrom.

17. A centrifugal cleaner for wafer carriers according to claim 1 and wherein there are a plurality of cleaning liquid spray manifolds; said spray manifolds including outer spray manifolds for spraying from outer positions inwardly toward wafer carriers held in the wafer carrier supports, and inner spray manifolds for spraying from inner positions outwardly toward wafer carriers held in the wafer carrier supports; and further comprising a plurality of drying gas manifolds for jetting drying gas upon the wafer carrier supports and any wafer carriers held therein to aid in drying cleaning liquid therefrom.

18. A centrifugal cleaner for wafer carriers according to claim 1 and wherein there are a plurality of cleaning liquid spray manifolds each having an array of nozzles; said spray manifolds including outer spray manifolds for spraying from outer positions inwardly toward wafer carriers held in the wafer carrier supports, and inner spray manifolds for spraying from inner positions outwardly toward wafer carriers held in the wafer carrier supports;
and further comprising a plurality of drying gas manifolds for jetting drying gas upon the wafer carrier supports and any wafer carriers held therein to aid in drying cleaning liquid therefrom.

19. A centrifugal cleaner for wafer carriers according to claim 1 and wherein there are a plurality of cleaning liquid spray manifolds; said spray manifolds including outer spray manifolds for spraying from outer positions inwardly toward wafer carriers held in the wafer carrier supports, and inner spray manifolds for spraying from inner positions outwardly toward wafer carriers held in the wafer carrier supports; and further comprising a plurality of drying gas manifolds for jetting drying gas upon the wafer carrier supports and any wafer carriers held therein to aid in drying cleaning liquid therefrom; said plurality of drying gas manifolds including outer gas manifolds for jetting from outer positions inwardly toward wafer carriers held in the wafer carrier supports, and inner gas manifolds for jetting from inner positions outwardly toward wafer carriers held in the wafer carrier supports.

20. A centrifugal cleaner for wafer carriers according to claim 1 and further comprising a two phase drain box which drains liquid and exhausts drying gas from near a bottom of the process chamber.

21. A centrifugal cleaner for wafer carriers according to claim 1 and further comprising a lower baffle spaced from and adjacent to a bottom of the process chamber.

22. A centrifugal cleaner for wafer carriers according to claim 1 and further defined by said entrance and exit doors being slidable.

23. A centrifugal cleaner for wafer carriers, comprising:
   a frame;
   a process chamber bowl supported upon the frame; said process chamber bowl defining a process chamber therewithin; said process chamber bowl further including an entrance port and an exit port; said entrance port being formed through the process chamber bowl to allow installation of wafer carriers into the process chamber therethrough; said exit port being formed through the process chamber bowl to allow removal of wafer carriers from the process chamber therethrough;
   an entrance door for controllably opening and closing said entrance port;
   an exit door for controllably opening and closing said exit port;
   a rotor mounted for rotation within the process chamber;
   a plurality of wafer carrier supports connected to said rotor for holding wafer carriers during centrifugal cleaning;
   rotor drive means for controllably rotating said rotor;
   at least one cleaning liquid spray manifold mounted within the process chamber for spraying a suitable cleaning liquid upon wafer carriers held in the wafer carrier supports;
   a liquid drain for draining cleaning liquid from the process chamber;
   at least one drying gas supply for supplying drying gas to the process chamber to dry said cleaning liquid wafer carriers;
   at least one drying gas filter for filtering contaminants from drying gas supplied to the process chamber through said at least one drying gas supply;
   at least one gas exhaust for exhausting drying gas from the process chamber.

24. A centrifugal cleaner for wafer carriers according to claim 23 and wherein the rotor extends upwardly from lower portions of the processing chamber.

25. A centrifugal cleaner for wafer carriers according to claim 23 and wherein the rotor extends upwardly from lower portions of the processing chamber within a rotor support housing mounted within the processing chamber.

26. A centrifugal cleaner for wafer carriers according to claim 23 and wherein the rotor extends upwardly from lower portions of the processing chamber within a rotor support housing mounted within the processing chamber; said rotor also including a rotor wheel along upper portions thereof; said rotor further including a rotor cage which is mounted to said rotor wheel and extends downwardly to support said plurality of wafer carrier supports.

27. A centrifugal cleaner for wafer carriers according to claim 23 and wherein the rotor extends upwardly from lower portions of the processing chamber within a rotor support housing mounted within the processing chamber; said rotor also including a rotor wheel along upper portions thereof; said rotor further including a rotor cage which is mounted to said rotor wheel and extends downwardly to support said plurality of wafer carrier supports; said at least one spray manifold including at least one inner spray manifold which extends upwardly within the processing chamber between the rotor cage and the rotor support housing.

28. A centrifugal cleaner for wafer carriers according to claim 23 and wherein the rotor extends upwardly from lower portions of the processing chamber within a rotor support housing mounted within the processing chamber; said rotor also including a rotor wheel along upper portions thereof; said rotor further including a rotor cage which is mounted to said rotor wheel and extends downwardly to support said plurality of wafer carrier supports; and wherein there are a plurality of cleaning liquid spray manifolds; said spray manifolds including outer spray manifolds for spraying from outer positions inwardly toward wafer carriers held in the wafer carrier supports, and inner spray manifolds for spraying from inner positions outwardly toward wafer carriers held in the wafer carrier supports; and inner spray manifolds extending upwardly within the processing chamber between the rotor cage and the rotor support housing.

29. A centrifugal cleaner for wafer carriers according to claim 23 and wherein the rotor extends upwardly from lower portions of the processing chamber; said rotor further including a rotor cage to support said plurality of wafer carrier supports.

30. A centrifugal cleaner for wafer carriers according to claim 23 and wherein the rotor includes a rotor shaft which extends upwardly from lower portions of the processing chamber; said rotor further including a rotor cage having downwardly extending portions; said at least one spray manifold including at least one inner spray manifold which extends upwardly within the processing chamber between the rotor cage and the rotor shaft.

31. A centrifugal cleaner for wafer carriers according to claim 23 and wherein the rotor includes a rotor shaft which extends upwardly from lower portions of the processing chamber; said rotor further including a rotor cage having downwardly extending portions; and wherein there are a plurality of cleaning liquid spray manifolds; said spray manifolds including outer spray manifolds positioned outwardly from the rotor cage for spraying from outer positions inwardly toward wafer carriers held in the wafer carrier supports, and inner spray manifolds for spraying from inner positions outwardly toward wafer carriers held in the wafer carrier supports; said inner spray manifolds extending upwardly within the processing chamber between the rotor cage and the rotor shaft.

32. A centrifugal cleaner for wafer carriers according to claim 23 and further comprising:
   at least one drying gas filter for filtering contaminants from drying gas supplied to the process chamber through said at least one drying gas supply;

at least one drying gas heater for heating drying gas supplied to the process chamber through said at least one drying gas supply.

33. A centrifugal cleaner for wafer carriers according to claim 23 and further comprising:
a drying gas plenum;
at least one drying gas filter for filtering contaminants from drying gas supplied to said drying gas plenum;
at least one drying gas heater mounted to the drying gas plenum for heating filtered drying gas;
and wherein filtered, heated drying gas from said plenum is supplied to the process chamber through said at least one drying gas supply.

34. A centrifugal cleaner for wafer carriers according to claim 23 and wherein at least one drying gas supply is approximately aligned with the rotational axis of said rotor.

35. A centrifugal cleaner for wafer carriers according to claim 23 wherein there are a plurality of cleaning liquid spray manifolds.

36. A centrifugal cleaner for wafer carriers according to claim 23 and wherein there are a plurality of cleaning liquid spray manifolds; said spray manifolds including outer spray manifolds for spraying from outer positions inwardly toward wafer carriers held in the wafer carrier supports, and inner spray manifolds for spraying from inner positions outwardly toward wafer carriers held in the wafer carrier supports.

37. A centrifugal cleaner for wafer carriers according to claim 23 wherein there are a plurality of cleaning liquid spray manifolds; and further comprising a plurality of drying gas manifolds for jetting drying gas upon the wafer carrier supports and any wafer carriers held therein to aid in drying cleaning liquid therefrom.

38. A centrifugal cleaner for wafer carriers according to claim 23 and wherein there are a plurality of cleaning liquid spray manifolds; said spray manifolds including outer spray manifolds for spraying from outer positions inwardly toward wafer carriers held in the wafer carrier supports, and inner spray manifolds for spraying from inner positions outwardly toward wafer carriers held in the wafer carrier supports; and further comprising a plurality of drying gas manifolds for jetting drying gas upon the wafer carrier supports and any wafer carriers held therein to aid in drying cleaning liquid therefrom.

39. A centrifugal cleaner for wafer carriers according to claim 23 and wherein there are a plurality of cleaning liquid spray manifolds each having an array of nozzles; said spray manifolds including outer spray manifolds for spraying from outer positions inwardly toward wafer carriers held in the wafer carrier supports, and inner spray manifolds for spraying from inner positions outwardly toward wafer carriers held in the wafer carrier supports;
and further comprising a plurality of drying gas manifolds for jetting drying gas upon the wafer carrier supports and any wafer carriers held therein to aid in drying cleaning liquid therefrom.

40. A centrifugal cleaner for wafer carriers according to claim 23 and wherein there are a plurality of cleaning liquid spray manifolds; said spray manifolds including outer spray manifolds for spraying from outer positions inwardly toward wafer carriers held in the wafer carrier supports, and inner spray manifolds for spraying from inner positions outwardly toward wafer carriers held in the wafer carrier supports; and further comprising a plurality of drying gas manifolds for jetting drying gas upon the wafer carrier supports and any wafer carriers held therein to aid in drying cleaning liquid therefrom; said plurality of drying gas manifolds including outer gas manifolds for jetting from outer positions inwardly toward wafer carriers held in the wafer carrier supports, and inner gas manifolds for jetting from inner positions outwardly toward wafer carriers held in the wafer carrier supports.

41. A centrifugal cleaner for wafer carriers according to claim 23 and further comprising a two phase drain box which drains liquid and exhausts drying gas from near a bottom of the process chamber.

42. A centrifugal cleaner for wafer carriers according to claim 23 and further comprising a lower baffle spaced from and adjacent to a bottom of the process chamber.

43. A centrifugal cleaner for wafer carriers according to claim 23 and further defined by said entrance and exit doors being slidable.

44. A centrifugal cleaner for wafer carriers, comprising:
a frame;
a process chamber bowl supported upon the frame; said process chamber bowl defining a process chamber therewithin; said process chamber bowl further including an entrance port and an exit port; said entrance port being formed through the process chamber bowl to allow installation of wafer carriers into the process chamber therethrough; said exit port being formed through the process chamber bowl to allow removal of wafer carriers from the process chamber therethrough, respectively;
an entrance door for controllably opening and closing said entrance port;
an exit door for controllably opening and closing said exit port;
an upstanding rotor mounted for rotation within the process chamber; said rotor having a rotor shaft within the process chamber; said rotor also including a rotor cage which has downwardly extending portions;
a plurality of wafer carrier supports connected to said rotor cage for holding wafer carriers during centrifugal cleaning;
rotor drive means for controllably rotating said rotor;
a plurality of cleaning liquid spray manifolds mounted within the process chamber for spraying a suitable cleaning liquid upon wafer carriers held in the wafer carrier supports; said liquid spray manifolds including outer spray manifolds for spraying from outer positions inwardly toward wafer carriers held in the wafer carrier supports, and inner spray manifolds for spraying from inner positions outwardly toward wafer carriers held in the wafer carrier supports; said inner spray manifolds extending upwardly within the processing chamber between the rotor cage and the rotor shaft;
a liquid drain for draining liquid from the process chamber;
at least one drying gas supply for supplying drying gas to the process chamber to dry said cleaning liquid from wafer carriers;
at least one drying gas filter for filtering contaminants from drying gas supplied to the process chamber through said at least one drying gas supply;
at least one gas exhaust for exhausting drying gas from the process chamber.

45. A centrifugal cleaner for wafer carriers according to claim 44 and further defined by said drying gas supply being positioned to supply drying gas from said drying gas filter toward upper portions of the rotor.

46. A centrifugal cleaner for wafer carriers according to claim 44 and further defined by said drying gas supply being positioned to supply drying gas from said drying gas filter toward upper portions of the rotor adjacent a rotor wheel which connects the rotor shaft and rotor cage; said rotor wheel being at least partially open to allow the rotor to induce drying gas flow when rotating.

47. A centrifugal cleaner for wafer carriers according to claim 44 and wherein the rotor extends upwardly from lower portions of the processing chamber within a rotor support housing mounted within the processing chamber.

48. A centrifugal cleaner for wafer carriers according to claim 44 and further comprising:
- at least one drying gas filter for filtering contaminants from drying gas supplied to the process chamber through said at least one drying gas supply;
- at least one drying gas heater for heating drying gas supplied to the process chamber through said at least one drying gas supply.

49. A centrifugal cleaner for wafer carriers according to claim 44 and further comprising:
- a drying gas plenum;
- at least one drying gas filter for filtering contaminants from drying gas supplied to said drying gas plenum;
- at least one drying gas heater mounted to the drying gas plenum for heating filtered drying gas;
- and wherein filtered, heated drying gas from said plenum is supplied to the process chamber through said at least one drying gas supply.

50. A centrifugal cleaner for wafer carriers according to claim 44 and wherein at least one drying gas supply is approximately aligned with the rotational axis of said rotor.

51. A centrifugal cleaner for wafer carriers according to claim 44 wherein there are a plurality of cleaning liquid spray manifolds; and further comprising a plurality of drying gas manifolds for jetting drying gas upon the wafer carrier supports and any wafer carriers held therein to aid in drying cleaning liquid therefrom.

52. A centrifugal cleaner for wafer carriers according to claim 44 and further comprising a plurality of drying gas manifolds for jetting drying gas upon the wafer carrier supports and any wafer carriers held therein to aid in drying cleaning liquid therefrom; said plurality of drying gas manifolds including outer gas manifolds for jetting from outer positions inwardly toward wafer carriers held in the wafer carrier supports, and inner gas manifolds for jetting from inner positions outwardly toward wafer carriers held in the wafer carrier supports.

53. A centrifugal cleaner for wafer carriers according to claim 44 and further comprising a two phase drain box which drains liquid and exhausts drying gas from near a bottom of the process chamber.

54. A centrifugal cleaner for wafer carriers according to claim 44 and further comprising a lower baffle spaced from and adjacent to a bottom of the process chamber.

55. A centrifugal cleaner for wafer carriers according to claim 44 and further defined by said entrance and exit doors being slidable.

* * * * *